United States Patent
Tomita (10) Patent No.: US 6,931,088 B1
(45) Date of Patent: Aug. 16, 2005

(54) SIGNAL PROCESSING CIRCUIT FOR PREVENTING PSEUDO LOCK OF TIMING RECOVERY PLL

(75) Inventor: Tsuyoshi Tomita, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/263,766

(22) Filed: Mar. 5, 1999

(30) Foreign Application Priority Data

Sep. 18, 1998 (JP) .................................. 10-265224

(51) Int. Cl.[7] .............................................. H03D 3/24
(52) U.S. Cl. ..................................................... 375/376
(58) Field of Search ................................ 375/373, 371, 375/375–376

(56) References Cited

U.S. PATENT DOCUMENTS 5,963,518 A * 10/1999 Kobayashi et al. ...... 369/47.27

6,600,779 B1 * 7/2003 Sawada et al. ............. 375/233

* cited by examiner

Primary Examiner—Kevin Burd
(74) Attorney, Agent, or Firm—Arent Fox PLLC (57) ABSTRACT

A signal processing circuit used in a hard disk controller is able to quickly match its clock signal with preamble data read from a hard disk. The signal processing circuit includes a decision feedback equalizer (DFE) that equalizes a digital read signal in accordance with a clock signal. A timing recovery PLL generates the clock signal having a phase which is coincident with a phase of the digital read signal. The DFE includes a first filter for filtering the digital signal, a decision circuit for adding a feedback signal to the filtered digital signal and generating a decision signal based on the value of the addition. A shift register is connected to the decision circuit and samples the decision signal in accordance with the clock signal, and stores the sampled signal as sampling data. A feedback filter filters the sampled data and feeds it back to the decision circuit. A loop control circuit monitors the filtered digital signal and the feedback signal and controls the feedback loop based on the values of these signals.

15 Claims, 5 Drawing Sheets

SIGNAL PROCESSING CIRCUIT FOR PREVENTING PSEUDO LOCK OF TIMING RECOVERY PLL

BACKGROUND OF THE INVENTION

The present invention generally relates to a signal processing circuit, and, more particularly, to a signal processing circuit for preventing the pseudo lock of a timing recovery PLL which generates a clock signal having a phase that is substantially coincident with the phase of a recording medium read signal.

Figure 1:
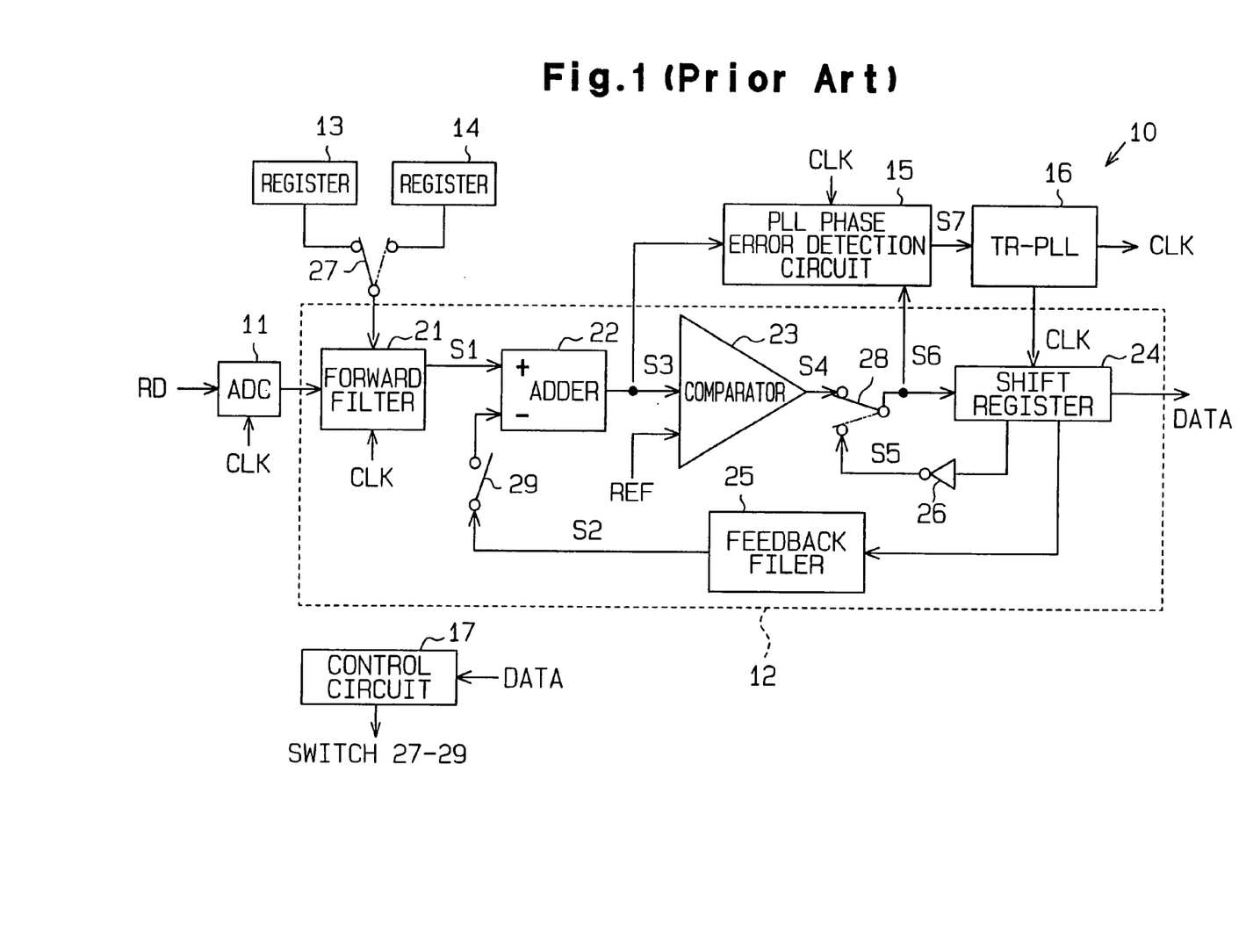
FIG. 1 is a schematic block diagram of a conventional signal processing circuit.

FIG. 1 is a schematic block diagram of a conventional signal processing circuit 10. The signal processing circuit 10 includes an analog-to-digital converter (ADC) 11, a decision feedback equalizer (DFE) 12, coefficient registers 13 and 14, a PLL phase error detection circuit 15, a timing recovery PLL (TR-PLL) 16, and a control circuit 17.

The ADC 11 samples an analog signal read from a recording medium in accordance with a clock signal CLK supplied from the TR-PLL 16 and converts the analog read signal to a digital read signal. The DFE 12 includes a forward (FW) filter 21, an adder 22, a comparator 23, a shift register 24, a feedback (FB) filter 25, an inverter circuit 26, and switches 27, 28, and 29.

The first and second coefficient registers 13 and 14 are connected to the FW filter 21 via the first switch 27. The first coefficient register 13 prestores a first filter coefficient (start value) used by the FW filter 21 at startup (i.e., initial read operation). The second coefficient register 14 prestores a second filter coefficient (normal value) used by the FW filter 21 during normal operation (after preamble data has been detected). At startup, the FW filter 21 receives the digital read signal supplied from the ADC 11 and the first filter coefficient via the first switch 27 and filters the digital read signal using the first filter coefficient so that the S/N (signal-to-noise) ratio is maximized. During normal operation, the FW filter 21 filters the digital read signal using the second filter coefficient.

The adder 22 receives the filtered digital read signal S1 from the FW filter 21 and a feedback signal S2 supplied from the FB filter 25 via the third switch 29 and adds the filtered digital read signal S1 and an inverse signal of the feedback signal S2. That is, the adder 22 functions as a subtractor that subtracts the feedback signal S2 from the filtered digital read signal S1.

The comparator 23 compares the voltage of an operation result signal S3 from the adder 22 and a reference voltage REF and generates a decision signal S4 of "1" or "0". The shift register 24 receives the decision signal S4 supplied from the comparator 23 via the second switch 28 and samples the decision signal S4 in accordance with the clock signal CLK. Thus, the shift register 24 stores sampling data (i.e., plural pieces of sampled bit data).

The data (decision signal S4) stored in the first-bit register of the shift register 24 is output from the shift register 24 as a reproduction data signal. In this manner, the DFE 12 reproduces the data recorded on the recording medium.

The FB filter 25 receives the sampling data from the shift register 24, eliminates inter-code interference contained in the sampling data, and generates the feedback signal S2.

The PLL phase error detection circuit (hereinafter referred as detection circuit) 15 receives the operation result signal S3 from the adder 22 and a signal S6 (the decision signal S4 from the comparator 23 or an output signal S5 of the inverter circuit 26), detects an error between the phase of the read signal and the phase of the clock signal CLK using the signals S3 and S6, and supplies a control signal S7 to the TR-PLL 16.

The TR-PLL 16 receives the control signal S7 from the detection circuit 15 and generates the clock signal CLK that is substantially coincident with the phase of the read signal in accordance with the control signal S7. Thus, the shift register 24 samples the decision signal S4 of the comparator 23 in accordance with the clock signal CLK (the bit transfer rate of the read signal RD).

The control circuit 17 controls each of the switches 27 to 29 based on the status of the data signal output from the shift register 24 and the number of bytes read from the start of the read operation. Predetermined preamble data is recorded on the recording medium. The preamble data is pattern data in which a predetermined bit is repeated continuously. Accordingly, the control circuit 17 controls each of the switches 27 to 29 in accordance with a predetermined timing based on the number of bytes of the preamble data. Specifically, the control circuit 17 controls each of the switches 27 to 29 as described below.

(1) When the read operation is started, the control circuit 17 switches the first switch 27 to the input of the first coefficient register 13, the second switch 28 to the output of the comparator 23, and the third switch 29 to OPEN. The FW filter 21 waveform-shapes the digital read signal from the ADC 11 using the first filter coefficient (start value) from the first coefficient register 13. The adder 22 supplies the filtered digital signal S1 from the FW filter 21 to the comparator 23. The detection circuit 15 supplies the control signal S4 to the TR-PLL 16 using the filtered digital read signal S1 and the decision signal S4. Accordingly, the TR-PLL 16 performs phase matching of the clock signal CLK using the read signal.

(2) When the bit string ("+++" or "---" in this case) of the preamble data is supplied from the shift register 24 to the control circuit 17 a predetermined number of times (for example, three times), the control circuit 17 switches the first switch 27 to the input of the second coefficient register 14, the second switch 28 to the output of the inverter circuit 26, and the third switch 29 to CLOSED. "+" indicates that the voltage of the sampled read signal RD is higher than the reference voltage REF, and "−" indicates the reverse.

The FW filter 21 waveform-shapes the digital read signal from the ADC 11 using the second filter coefficient (normal value) from the second coefficient register 14. The shift register 24 receives the sampling data of the shift register 24 inverted by the inverter circuit 26 via the second switch 28. Accordingly, the shift register 24 repeatedly stores the bit string "+++---" of the preamble data. Consequently, the data stored in the shift register is initialized as the preamble data.

The adder 22 receives the filtered digital read signal S1 supplied from the FW filter 21 and the feedback signal S2 supplied from the FB filter 25 via the third switch 29 and adds the filtered digital read signal S1 and the feedback signal S2.

(3) The control circuit 17 counts the number of data pieces supplied from the shift register 24 after the control of the aforementioned (2) and enables frequency matching of the TR-PLL 16 after a predetermined number of data pieces (for example, five bytes) are counted.

(4) The control circuit 17 counts the number of data pieces supplied from the shift register 24 after the control of the aforementioned (3) and switches (maintains) the first switch 27 to the input of the second coefficient register 14, the second switch 28 to the output of the comparator 23, and the third switch 29 to CLOSED. Thus, the TR-PLL 16 performs the phase matching of the clock signal CLK and the DFE 12 outputs a reproduction signal in accordance with the clock signal CLK.

However, high speed information reading of recording medium (or the high density of the recording medium) shortens the read period of the preamble data and the phase matching time of the TR-PLL 16. In other words, the setting change of the FW filter 21, the on/off control of the feedback loop, the preamble synchronization of the shift register 24, and the time for initializing the feedback loop by the control circuit 17 are shortened. As a result, the control timing for each of the switches 27 to 29 using the control circuit 17 becomes inaccurate, and the phase matching of the TR-PLL 16 is not performed accurately. Accordingly, valid read data is not obtained.

The control circuit 17 determines the control timing for each of the switches 27 to 29 based on the number of preamble data pieces. That is, the control circuit 17 does not perform the timing control until the predetermined number of data pieces is supplied even if the phase of the clock signal CLK and the phase of the read signal are substantially coincident at an early stage. This prolongs the phase matching time of the TR-PLL 16.

Further, phase control advances or delays the phase of the clock signal CLK. If the feedback loop is closed (i.e., the third switch 29 is closed) when phase matching of the clock signal CLK is not completed, the TR-PLL 16 may fall into a pseudo lock condition. Specifically, when the phase matching is not complete, the feedback signal S2 having a higher value than the desired value is supplied to the adder 22. In this case, the decision result of the preamble data by the comparator 23 ends in a result (for example, "++----") that is different from the original decision result. In the decision result, the amount of control for advancing and delaying the phase substantially become equal. As a result, the TR-PLL16 generates a stable clock signal CLK at a frequency shifted from the frequency of the read signal RD. When the TR-PLL 16 is pseudo-locked, it is necessary to resume the read operation, which delays the read speed. One way to prevent the pseudo lock is to increase the number of preamble data pieces. However, increasing the number of preamble data pieces hinders high-density recording on the recording medium and high-speed reading.

It is an object of the present invention to provide a signal processing circuit that prevents pseudo lock of the timing recovery PLL.

SUMMARY OF THE INVENTION

In one aspect of the present invention, a signal processing circuit includes a decision feedback equalizer for waveform-equalizing a digital signal in accordance with a clock signal and generating the waveform-equalized digital signal. A timing recovery PLL generates the clock signal having a phase which is substantially coincident with the phase of the digital signal based on the phase difference between the digital signal and the clock signal and supplies the clock signal to the decision feedback equalizer. The decision feedback equalizer includes a prefilter for filtering the digital signal and generating a filtered digital signal. A decision circuit adds a feedback signal and the filtered digital signal, generates an addition signal and analyzes the addition signal in accordance with predetermined criteria to generate a decision signal. A shift register samples the decision signal in accordance with the clock signal and storing sampling data. The sampling data stored in the shift register is output from the shift register as the waveform-equalized digital signal. A feedback filter receives the sampling data and generating the feedback signal using the sampling data. A loop control circuit monitors the filtered digital signal and the feedback signal and controls a feedback loop formed by the decision circuit, the shift register, and the feedback filter based on a monitoring result.

In another aspect of the present invention, a feedback control of a signal processor method is provided. First, a digital signal is filtered to generate a filtered digital signal. A feedback signal and the filtered digital signal are added to generate the addition signal. The addition signal is analyzed in accordance with predetermined criteria to generate a decision signal. The decision signal is sampled in accordance with a clock signal to store sampling data in a shift register. The feedback signal is generated using the sampling data stored in the shift register. The clock signal, which is substantially coincident with the phase of the digital signal, is generated based on a phase difference between the digital signal and the clock signal. The filtered digital signal and the feedback signal are monitored. Then, whether the feedback signal is fed back to the step of generating the addition signal is selected based on a monitoring result.

In yet another aspect of the present invention, a feedback control of a signal processor is provided. First, a digital signal is filtered to generate a filtered digital signal. A feedback signal and the filtered digital signal are added to generate the addition signal. The addition signal is analyzed in accordance with predetermined criteria to generate a decision signal. The decision signal is sampled in accordance with a clock signal to store sampling data in a shift register. The feedback signal is generated using the sampling data stored in the shift register. A first phase difference between the digital signal and the clock signal are generated using the decision signal and a first reference signal. The first reference signal has a first predetermined value at preset control point of the filtered digital signal. Then, the clock signal is generated having a phase which is substantially coincident with the phase of the digital signal, based on a first phase difference. Whether the first phase difference is within a predetermined range is determined. The feedback signal is fed back to the step of generating the addition signal when the first phase difference is within the predetermined range. A second phase difference between the digital signal and the clock signal is generated using the decision signal and a second reference signal. The second reference signal has a second predetermined value at the preset control point preset of the decision signal. Then, the clock signal having a phase which is substantially coincident with the phase of the digital signal is generated based on the second phase difference.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiment together with the accompanying drawings in which.

DETAILED DESCRIPTION OF THE PREFERRED EMBODIMENTS

In the drawings, like numerals are used for like elements throughout.

Figure 2:
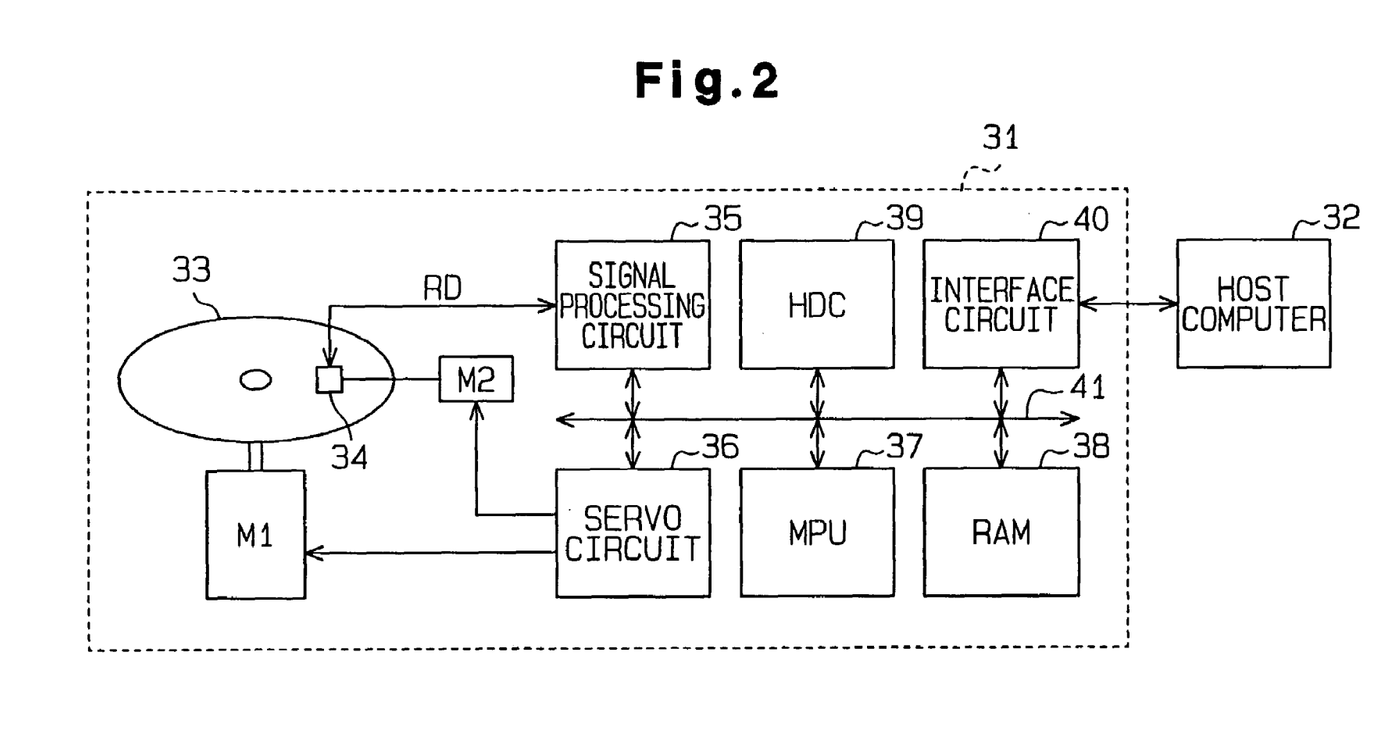
FIG. 2 is a schematic block diagram of a hard disk drive.

FIG. 2 is a schematic block diagram of a hard disk drive. The hard disk drive 31 is connected to a host computer 32 and records data supplied from the host computer 32 on a recording medium, such as a magnetic disk 33 in response to a write request from the host computer 32. The hard disk drive 31 reads the data recorded on the magnetic disk 33 in response to a read request from the host computer 32 and supplies the data to the host computer 32.

The hard disk drive 31 includes the magnetic disk 33, first and second motors M1 and M2, a head device 34, a signal processing circuit 35, a servo circuit 36, a microprocessor unit (MPU) 37, a memory device (RAM) 38, a hard disk controller (HDC) 39, and an interface circuit 40. Each of the circuits 35 to 40 is connected via a bus 41.

The magnetic disk 33 is driven by the first motor M1 at a constant rotational speed. The movement of the head device 34 in the radial direction of the magnetic disk 33 is controlled by the second motor M2. The head device 34 reads the information recorded on the magnetic disk 33 and supplies an analog read signal RD to the signal processing circuit 35.

The signal processing circuit (called a read/write channel IC) 35 samples the analog read signal RD and converts the analog read signal RD to a digital read signal. The signal processing circuit 35 also decodes the digital read signal.

The servo circuit 36 receives the digital read signal from the signal processing circuit 35, and based on servo information contained in the digital read signal, controls the second motor M2 to move the head device 34 and also controls the first motor M1 for rotating the magnetic disk 33 at a constant speed.

The MPU 37 analyzes a read/write command supplied from the host computer 32 in accordance with a program prestored in the RAM 38 and supplies a control signal to the HDC 39. The HDC 39 controls the signal processing circuit 35 and the servo circuit 36 in accordance with the control signal from the MPU 37.

The HDC 39 receives a data signal decoded from the signal processing circuit 35, performs ECC (error correcting code) processing on the decoded data in a sector unit, and supplies error corrected data to the interface circuit 40. The interface circuit 40 converts the error corrected data from the HDC 39 to data conforming to a predetermined communication protocol and supplies read data to the host computer 32.

Figure 3:
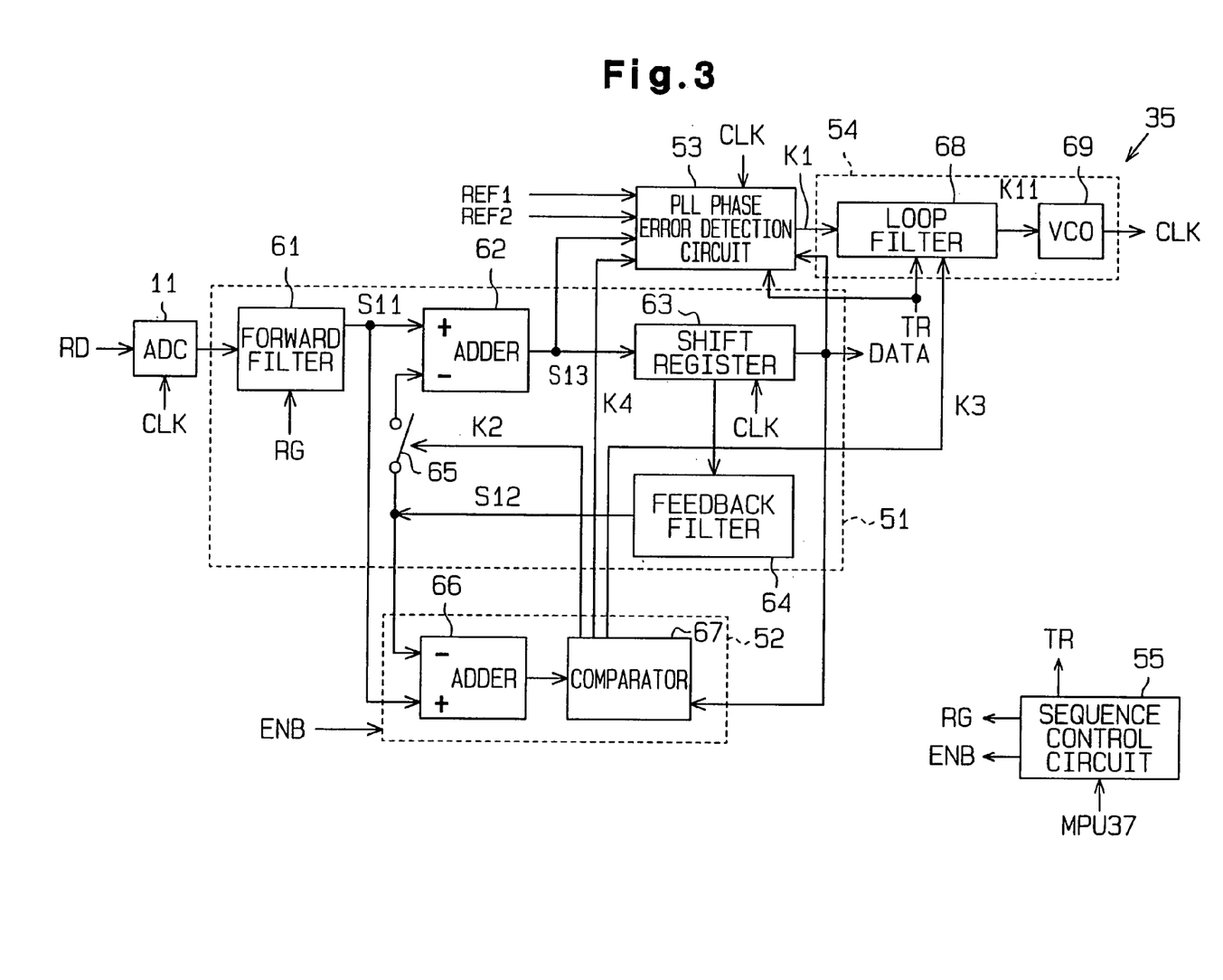
FIG. 3 is a schematic block diagram of the signal processing circuit of the hard disk drive of FIG. 2 according to a first embodiment of the present invention.

FIG. 3 is a schematic block diagram of the signal processing circuit 35. The signal processing circuit 35 includes the analog-to-digital converter (ADC) 11, a decision feedback equalizer (DFE) 51, a feedback loop control circuit 52, a PLL phase error detection circuit 53, a timing recovery PLL (TR-PLL) 54, and a sequence control circuit 55. The DFE 51 includes a forward (FW) filter (prefilter) 61, an adder 62, a shift register 63, a feedback (FB) filter (feedback filter) 64, and a switch 65.

The ADC 11 samples the analog signal read from the recording medium 33 in accordance with a clock signal supplied from the TR-PLL 54 and converts the analog read signal RD to a digital read signal. The FW filter 61 receives the digital read signal from the ADC 11 and waveform-shapes the digital read signal in response to a read gate signal RG supplied from the sequence control circuit 55 so that the S/N ratio of the digital read signal is maximized. The FW filter 61 is a digital filter having a predetermined transfer characteristic.

The adder 62 receives the filtered digital read signal S11 from the FW filter 61 and a feedback signal S12 from the FB filter 64 and adds the filtered digital read signal S11 and an inverse signal of the feedback signal S12. In other words, the adder 62 functions as a subtractor that subtracts the feedback signal S12 from the filtered digital read signal S11. The adder 62 further compares the calculation result and a reference voltage REF (not illustrated) and supplies a decision signal S13 of either "1" or "0" to the shift register 63.

The shift register 63 samples the decision signal S13 in accordance with the clock signal CLK and stores the sampling data. Hence, the shift register 63 stores plural pieces of sampled bit data.

The data (decision signal S13) stored in the first-bit register of the shift register 63 is output from the shift register 63 as a reproduction data signal. The output data is the data recorded on a recording medium, representing the data stored on the recording medium 33. In this manner, the DFE 51 reproduces the data stored on the recording medium 33. After the reproduction data signal is decoded, it is supplied to the HDC 39.

The FB filter 64 receives the sampling data from the shift register 63, eliminates inter-code interference contained in the sampling data, and supplies the feedback signal S12 to the adder 62 via the switch 65.

The PLL phase error detection circuit (hereinafter referred as the detection circuit) 53 receives a control signal K4 from the feedback loop control circuit 52, the addition signal S13 from the adder 62, and first and second reference signals REF1 and REF2, detects an error between the phase of the read signal and the phase of the clock signal CLK generated by the TR-PLL 54, and supplies a control signal K1 to the TR-PLL 54 in accordance with the detection result. The first reference signal REF1 has a value preset based on the ideal preamble read signal RD at a specific point where the signal S11 changes from 0 to 1 or from 1 to 0. The second reference signal REF2 has a value preset based on the ideal preamble read signal RD at a specific point of the decision signal S13 from the adder 62 after the feedback loop has been closed. The value of the second reference signal REF2 is preferably less than the value of the first reference signal REF1.

The TR-PLL 54 generates the clock signal CLK having a phase that is substantially coincident with the phase of the read signal RD in accordance with the control signal K1 from the detection circuit 53 and supplies the clock signal CLK to the shift register 63 and the ADC 11. The shift register 63 samples the decision signal S13 supplied from the adder 62 in accordance with the clock signal CLK (bit transfer rate of the read signal RD) and stores the sampling data (recording data of the magnetic disk 33).

The feedback loop control circuit (hereinafter referred as the loop control circuit) 52 receives the sampling data signal from the shift register 63 and the filtered digital signal S11 from the FB filter 61 and controls the switch 65 (feedback loop of the DFE 51), the detection circuit 53, and the TR-PLL 54 in response to an enable signal ENB. The loop control circuit 52 specifies a control point based on the sampling data signal from the shift register 63 and monitors the value of the filtered digital signal S11 and the value of the feedback signal S12 at the control point. The loop control circuit 52 controls the feedback loop, the phase comparison gain of the detection circuit 53, and the TR-PLL 54 based on the monitoring result at the control point.

The loop control circuit 52 calculates an "FW-FB" value by subtracting the value of the feedback signal S12 (FB) from the value of the filtered digital signal S11 (FW). The loop control circuit 52 further specifies a control point where the sampling data signal changes from 0 to 1 or from 1 to 0 and preferably always monitors at the control point whether the "FW-FB" value is within a predetermined range. When the "FW-FB" value is within the predetermined range, a control signal K2 is supplied to the switch 65. The switch 65 (feedback loop of the DFE 52) is turned on/off in accordance with the control K2. The "FW-FB" value at the control point indicates the direction (leading or delay) of a phase shift. In other words, when the direction of the phase of the sampling data signal at the control point is substantially coincident with the direction of the phase indicated by the "FW-FB" value, the feedback loop is closed. In this manner, the pseudo lock of the TR-PLL 54 is prevented by the loop control circuit 52.

The "FW-FB" value at the control point corresponds to the amount of phase shift. The loop control circuit 52 closes the feedback loop in accordance with the amount of phase shift without waiting for the input of the predetermined number of data pieces as the prior art. Accordingly, control is started sooner, and the read time is shortened.

The loop control circuit 52 supplies a control signal K3 to the TR-PLL 54 based on the monitoring result. The TR-PLL 54 starts the phase matching of the clock signal CLK in response to the control signal K3 from the loop control circuit 52 when the feedback loop is closed. Accordingly, the phase matching time of the TR-PLL 54 is shortened.

The loop control circuit 52 supplies the control signal K4 to the detection circuit 53 based on the monitoring result. The detection circuit 53 performs a phase comparison with a higher phase comparison gain than that during normal operation in response to the control signal K4. In other words, the TR-PLL 54 supplies the control signal K4 to the TR-PLL 54 so that the amount of control of the TR-PLL 54 that corresponds to the phase error increases (the amount of control of phase matching increases). This shortens the phase matching time of the TR-PLL 54.

The loop control circuit 52 includes an adder 66 and a comparator 67. The adder 66 receives the filtered digital signal S11 and the feedback signal S12 and adds the filtered digital signal S11 and the inverse signal of the feedback signal S12. In other words, the adder 66 functions as a subtractor that subtracts the feedback signal S12 from the filtered digital signal S11. The comparator 67 receives an operation result value "FW-FB" from the adder 66 and the sampling data from the shift register 63 and compares the operation result value and decision values min and max. The decision values min and max are prestored in the comparator 67. The decision value min is the minimum value in the predetermined range, and the decision value max is the maximum value in the predetermined range. The comparator 67 determines whether the operation result value "FW-FB" is within the range set by the decision values min and max and outputs the control signals K2 to K4 based on the decision result.

The detection circuit 53 receives the control signal K4 and the first and second reference signals REF1 and REF2. The first and second reference signals REF1 and REF2 correspond to the phase comparison gain. As described above, the value of the second reference signal REF2 is preferably less than the value of the first reference signal REF1. Accordingly, the phase comparison gain using the first reference signal REF1 is higher than the phase comparison gain using the second reference signal REF2. The detection circuit 53 detects a phase error using the first and second reference signals REF1 and REF2 and supplies the pulse signal (control signal) K1, which corresponds to the phase error, to the TR-PLL 54.

The TR-PLL 54 includes a loop filter 68 and a voltage-controlled oscillator (VCO) 69. The loop filter 68 receives the pulse signal K1 from the detection circuit 53, smoothes the pulse signal K1, and supplies a direct current voltage signal K11 to the VCO 69. In other words, the loop filter 44 raises and drops the voltage of the direct current voltage signal K11 in accordance with the phase difference signal K1 between the addition signal S13 and the clock signal CLK. The VCO 69 outputs the clock signal CLK having a frequency which corresponds to the direct current voltage signal K11 to the ADC 11, the detection circuit 53, and the shift register 63. In other words, the VCO 69 performs phase matching in accordance with the direct voltage signal K11 so that the frequency of the clock signal CLK is substantially coincident with the frequency of the read signal RD.

The sequence control circuit 55 receives a read control signal from the MPU 37 and is activated in response to the read control signal. The activated sequence control circuit 55 supplies the read gate signal RG to the FW filter 61 in accordance with the predetermined read sequence, supplies the enable signal ENB to the loop control circuit 52, and supplies a control signal TR to the detection circuit 53 and the loop filter 68.

Figure 4:
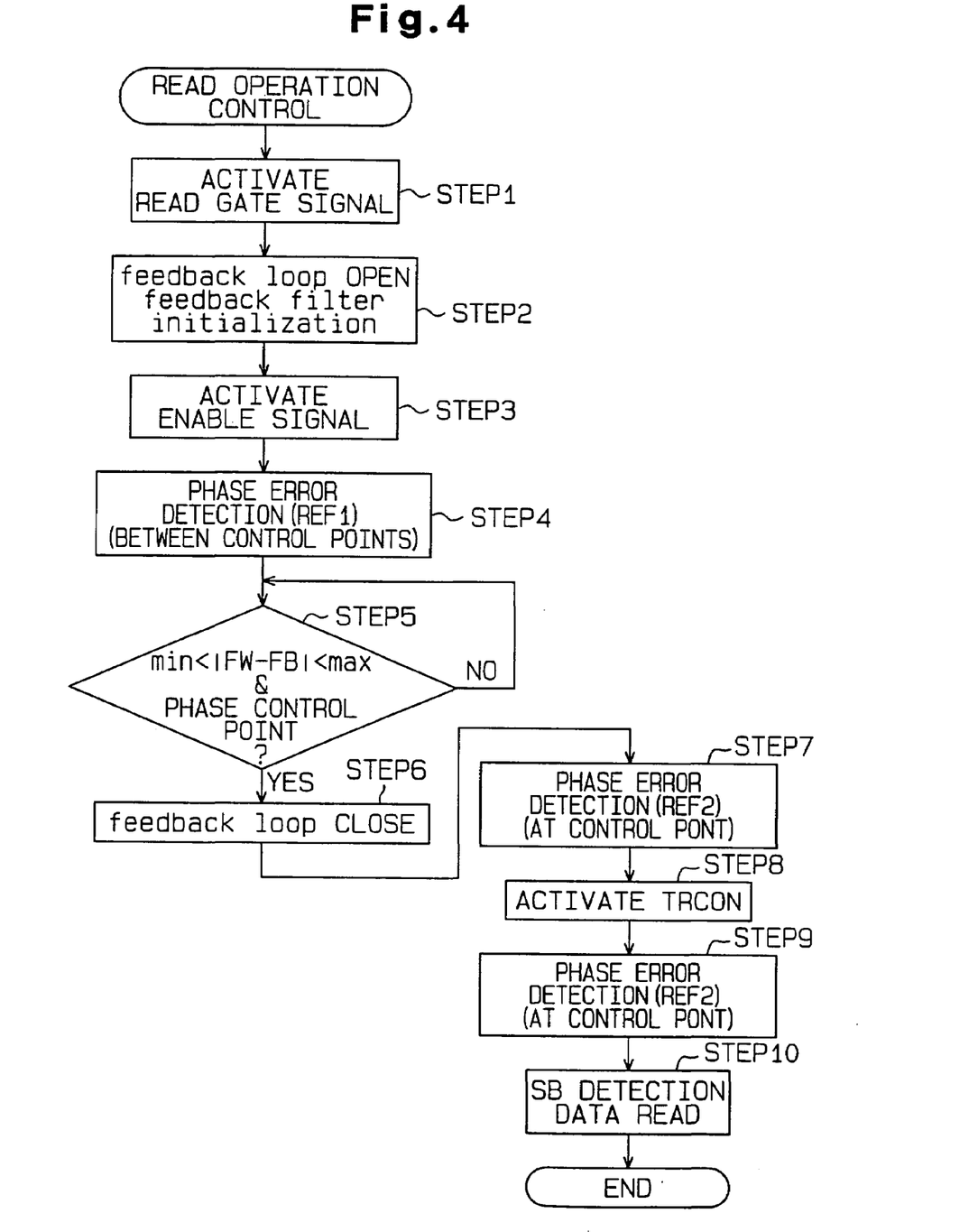
FIG. 4 is a flowchart showing the operation of the signal processing circuit of FIG. 3.
Figure 5:
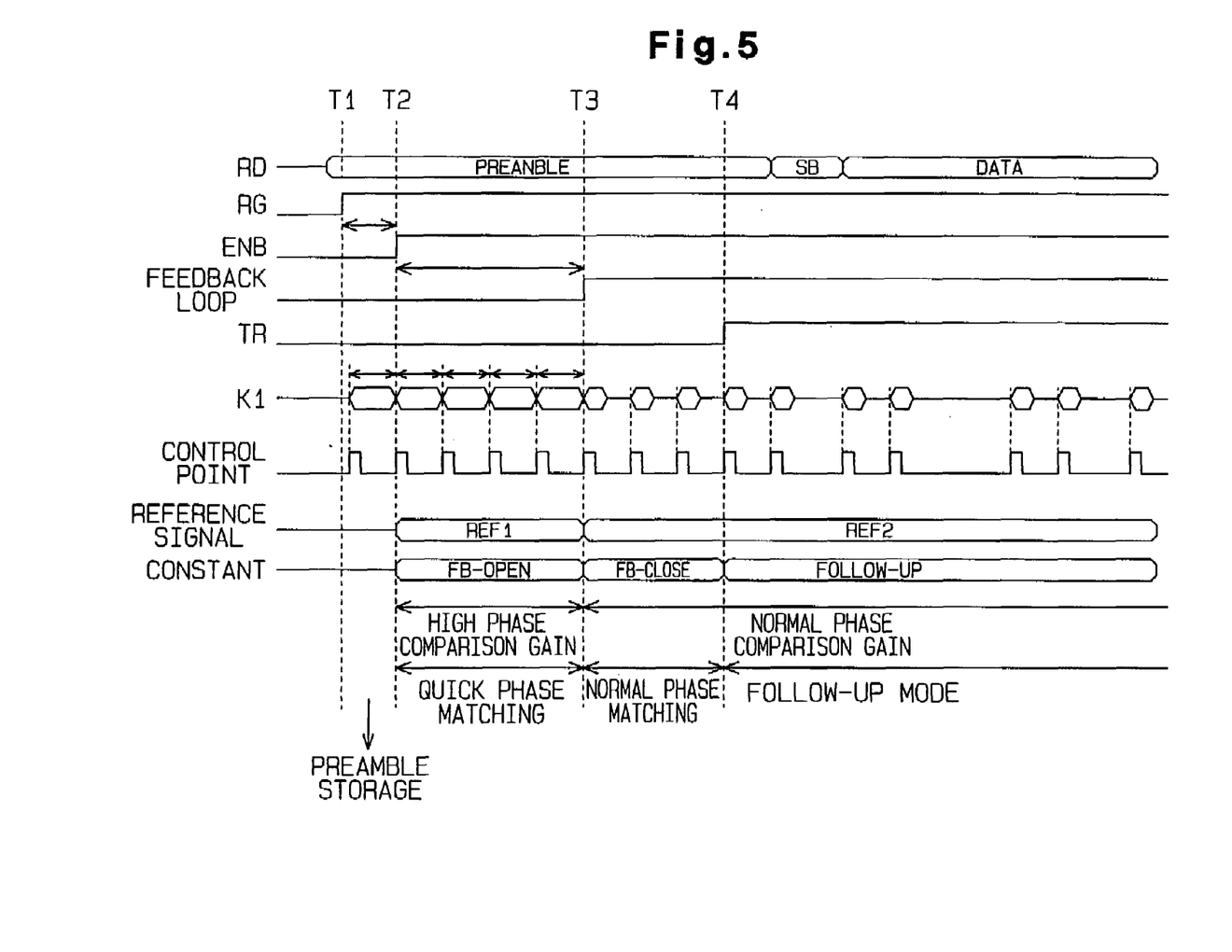
FIG. 5 is a timing diagram describing the operation timing of the signal processing circuit of FIG. 3.

Referring now to FIGS. 4 and 5, the operation of the signal processing circuit 35 will be described. FIG. 4 is a flowchart describing the operation of the signal processing circuit 35. FIG. 5 is a timing chart of the operation of the signal processing circuit 35.

First, when a control signal is supplied from the MPU 37 to the sequence control circuit 55, a read gate signal RG High is supplied to the FW filter 61 at a time T1 (step 1). The FW filter 61 filters the digital read signal from the ADC 11 in response to the read gate signal RG High and supplies the filtered data signal S11 to the adder 62. At this time, the loop control circuit 52 supplies the control signals K2 to K4 to the switch 65, the loop filter 68, and the detection circuit 53 in order to open the feedback loop and to turn off the PLL control (step 2). Thus, the digital read signal S11 of the preamble data output from the FW filter 61 is supplied to the shift register 63 via the adder 62, and the code bit of the preamble data is stored in the shift register 63.

Subsequently, an enable signal ENB High is supplied from the sequence control circuit 55 to the loop control circuit 52 at a time T2 (step 3). The loop control circuit 52 supplies the control signal K4 to the detection circuit 53 in response to the enable signal ENB High. The detection circuit 53 supplies the control signal K1, which corresponds to a phase error, to the loop filter 68 in response to the control signal K4 using the first reference signal REF1 and the decision signal S13 (step 4). The loop filter 68 sets a filter constant, which corresponds to Feedback Loop open, in response to the control signal K1 (FB-OFF setting). The control signal K1 is generated by the high phase comparison gain of the detection circuit 53 in accordance with the control from the loop control circuit 52. Accordingly, the amount of control (e.g. high level pulse width, or duty ratio) of the control signal K1 is relatively high. The loop filter 68 smoothes the control signal K1 and supplies the direct current voltage signal K1 to the VCO 69. At this time, because the amount of control of the control signal K1 is relatively high, the loop filter 68 supplies the direct current voltage signal K11 to the VCO 69 for a longer time than the normal operation. Accordingly, the VCO 69 performs the phase matching of the clock signal CLK in a shorter time than for a normal operation. Thus, the TR-PLL 54 quickly performs the phase matching of the clock signal CLK based on the phase difference between the addition signal S13 (code decision result or reproduction result) of the adder 62 and the clock signal CLK.

Subsequently, the comparator 67 of the loop control circuit 52 compares the operation result "FW-FB" value of the adder 66 and the decision values min and max and determines whether the "FW-FB" value is within a range specified by the decision values min and max at the predetermined control point (step 5).

When the "FW-FB" value is not within the range, the loop control circuit 52 repeats step 5 in the predetermined control point until the "FW-FB" value is within the range. When the "FW-FB" value is within the predetermined range at the time T3, the comparator 67 supplies the control signal K2 High to the switch 65. The switch 65 is turned on in response to the control signal K2 High, and the feedback loop is closed (step 6).

The detection circuit 53 receives the control signal K4, which corresponds to the control signal K2 High, from the comparator 67 and detects an error using the second reference signal REF2 and the decision signal S13. The loop filter 68 receives the control signal K3, which corresponds to the control signal K2 High, from the comparator 67 and sets a constant that corresponds to Feedback Loop close (FB-ON setting). Thus, the TR-PLL 54 performs the normal phase matching operation (step 7).

At time T4 when a predetermined period has elapsed from the time T3, the sequence control circuit 55 supplies a control signal TR High to the detection circuit 53 and the loop filter 68 (step 8). The TR-PLL 54 controls a PLL loop in response to the control signal TR High (TR CON).

The detection circuit 53 updates or follows up the phase error detection in response to the control signal TR using the second reference signal REF2 and the decision signal S13. The loop filter 68 sets a loop constant that corresponds to the follow-up operation (follow-up setting) (step 9). This loop constant corresponds to a sink byte (SB) and recording data (DATA) read following the preamble data. The value of the loop constant changes the frequency of the clock signal CLK to a predetermined value.

Next, the sequence control circuit 55 supplies the sink byte detection signal to the MPU 37 when the sink byte (SB) is detected. The MPU 37 handles the bit data supplied from the signal processing circuit 35 following the sink byte as recording data in accordance with the sink byte detection signal and processes the recording data (step 10).

(1) In the embodiment, the digital read signal S11 and the feedback signal S12 are monitored by the loop control circuit 54, and the feedback loop is controlled based on the monitoring result. Accordingly, the pseudo lock of the timing recovery PLL 54, which performs the phase matching of the clock signal CLK using the digital read signal S11 and the feedback signal S12, is prevented.

(2) The minimum decision value min and the maximum decision value max in the predetermined range are prestored in the comparator 67. At the specific control point of the sampling data of the shift register 63, when the difference between the digital read signal S11 and the feedback signal S12 is within the predetermined range, the feedback loop is closed. At this time, the value of the addition signal output from the adder 66 is substantially the same as the value of the decision signal S13 output from the adder 62. Accordingly, when the feedback loop is closed, the value of the decision signal S13 is within the predetermined range. This sets a desired initial value in the shift register 63 and suppresses the excess response of the feedback loop. As a result, the phase matching time of the TR-PLL 54 is shortened.

(3) The amount of the preamble data recorded on the magnetic disk 33 is reduced by shortening the phase matching time of the TR-PLL 54. This allows the recording area of the recording data and the recording density of the magnetic disk 33 to be increased.

It should be apparent to those skilled in the art that the present invention may be embodied in many other specific forms without departing from the spirit or scope of the invention. Therefore, the present examples and embodiment are to be considered as illustrative and not restrictive and the invention is not to be limited to the details given herein, but may be modified within the scope and equivalence of the appended claims.

What is claimed is:

1. A signal processing circuit, comprising:
a decision feedback equalizer for waveform-equalizing a digital signal in accordance with a clock signal and generating the waveform-equalized digital signal; and
a timing recover PLL, connected to the decision feedback equalizer, for generating the clock signal, the clock signal having a phase which is substantially coincident with the phase of the digital signal, based on the phase difference between the digital signal and the clock signal, and supplying the clock signal to the decision feedback equalizer, wherein the decision feedback equalizer includes,
a prefilter for filtering the digital signal and generating a filtered digital signal,
a decision circuit, connected to the prefilter, for performing a calculation with a feedback signal and the filtered digital signal and generating a calculation signal, and for analyzing the calculation signal in accordance with predetermined criteria to generate a decision signal,
a shift register, connected to the decision circuit, for sampling the decision signal in accordance with the clock signal and storing sampling data, wherein the sampling data stored in the shift register is output from the shift register as the waveform-equalized digital signal,
a feedback filter, connected to the shift register, for receiving the sampling data and generating the feedback signal using the sampling data, and
a loop control circuit for calculating a phase difference between the filtered digital signal and the feedback signal and controlling a feedback loop formed by the decision circuit, the shift register, and the feedback filter based on the phase difference.

2. The signal processing circuit of claim 1, wherein the loop control circuit generates a control signal for controlling the feedback loop, and the signal processing circuit further comprising a switch, connected between the feedback filter and the decision circuit, responsive to the control signal.

3. The signal processing circuit of claim 1, wherein the loop control circuit calculates an error between the filtered signal and the feedback signal and controls the feedback loop when the error is within a predetermined range at a specific preset control point of the waveform-equalized digital signal.

4. The signal processing circuit of claim 3, further comprising a detection circuit, connected between the decision circuit and the timing recovery PLL, for detecting the phase difference between the decision signal and the clock signal and supplying the detected phase difference to the timing recovery PLL as the phase difference between the digital signal and the clock signal.

5. The signal processing circuit of claim 4, wherein the detection circuit has a plurality of phase comparison gains, and the loop control circuit supplies a control signal to the detection circuit to change the phase comparison gains based on the monitoring result.

6. The signal processing circuit of claim 4, wherein the loop control circuit generates a control signal for controlling the phase difference detected by the detection circuit based on the monitoring result, the detection circuit receives first and second reference signals and the decision signal and supplies the difference between one of the first and second reference signal and the decision signal to the timing recovery PLL as the phase difference in accordance with the control signal, the first reference signal has a first predetermined value at the preset control point of the filtered digital signal, and the second reference signal has a second predetermined value at the preset control point of the decision signal.

7. The signal processing circuit of claim 3, wherein the loop control circuit includes:
an adder, connected to the prefilter and the feedback filter, for receiving the filtered digital signal and the feedback signal and calculating the error between the filtered digital signal and the feedback signal; and
a comparator, connected to the adder, receiving the error from the adder, comparing the error and a value having a predetermined range, and controlling the feedback loop based on the comparison result.

8. The signal processing circuit of claim 7, wherein the comparator prestores minimum and maximum values defining the predetermined range.

9. In a signal processor, a feedback control method comprising the steps of:
filtering a digital signal to generate a filtered digital signal;
performing a calculation with a feedback signal and the filtered digital signal to generate a calculation signal;
analyzing the calculation signal in accordance with predetermined criteria to generate a decision signal;
sampling the decision signal in accordance with a clock signal to store sampling data in a shift register;
generating the feedback signal using the sampling data stored in the shift register;
generating the clock signal, which is substantially coincident with the phase of the digital signal, based on a phase difference between the digital signal and the clock signal;
calculating a phase difference between the filtered digital signal and the feedback signal; and
selecting whether the feedback signal is fed back to the step of generating the addition signal based on the phase difference.

10. The method of claim 9, wherein the step of selecting the feedback includes the steps of:
calculating an error between the filtered digital signal and the feedback signal; and
executing the feedback step when the error is within a predetermined range at a specific preset control point of the sampling data.

11. The method of claim 10, wherein the step of selecting the feedback further includes the step of defining the predetermined range using a minimum value and a maximum value.

12. The method of claim 9, further comprising the step of detecting the phase difference between the decision signal and the clock signal, and wherein the step of generating the clock signal includes generating the clock signal substantially coincident with the phase of the digital signal, based on the detected phase difference.

13. The method of claim 12, wherein the step of detecting the phase difference includes detecting the phase difference between the decision signal and the clock signal using a plurality of phase comparison gains, and the method further comprises the step of determining one of the plurality of phase comparison gains based on the monitoring result.

14. The method of claim 12, wherein the step of detecting the phase difference includes detecting the difference between one of the first or second reference signal and the decision signal as the phase difference, the first reference signal has a first predetermined value at the preset control point of the filtered digital signal, and the second reference signal has a second predetermined value at the preset control point of the decision signal, and the method further comprises the step of selecting one of the first and second reference signals based on the monitoring result.

15. In a signal processor, a feedback control method comprising the steps of:
filtering a digital signal to generate a filtered digital signal;
adding a feedback signal and the filtered digital signal to generate the addition signal;
analyzing the addition signal in accordance with predetermined criteria to generate a decision signal;
sampling the decision signal in accordance with a clock signal to store sampling data in a shift register;
generating the feedback signal using the sampling data stored in the shift register;
calculating a first phase difference between the digital signal and the clock signal using the decision signal and a first reference signal, wherein the first reference signal has a first predetermined value at preset control point of the filtered digital signal;
generating the clock signal having a phase which is substantially coincident with the phase of the digital signal, based on a first phase difference;
determining whether the first phase difference is within a predetermined range;
feeding back the feedback signal to the step of generating the addition signal when the first phase difference is within the predetermined range;
calculating a second phase difference between the digital signal and the clock signal using the decision signal and a second reference signal, wherein the second reference signal has a second predetermined value at the preset control point preset of the decision signal; and
regenerating the clock signal having a phase which is substantially coincident with the phase of the digital signal, based on the second phase difference.

* * * * *